United States Patent
Takahashi

(10) Patent No.: US 8,273,419 B2
(45) Date of Patent: Sep. 25, 2012

(54) METHOD OF FORMING GAS BARRIER LAYERS INCLUDING A CHANGE IN PRESSURE, A GAS BARRIER LAYER FORMED BY THE METHOD, AND A GAS BARRIER FILM

(75) Inventor: Toshiya Takahashi, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 468 days.

(21) Appl. No.: 12/541,627

(22) Filed: Aug. 14, 2009

(65) Prior Publication Data
US 2010/0075150 A1 Mar. 25, 2010

(30) Foreign Application Priority Data
Sep. 24, 2008 (JP) ................... 2008-244028

(51) Int. Cl.
H05H 1/24 (2006.01)
(52) U.S. Cl. ............ 427/569; 427/578; 427/579
(58) Field of Classification Search .............. 427/569, 427/578, 579
See application file for complete search history.

(56) References Cited

U.S. PATENT DOCUMENTS

| | | | | |
|---|---|---|---|---|
| 4,254,169 A | * | 3/1981 | Schroeder | 428/36.6 |
| 6,492,026 B1 | * | 12/2002 | Graff et al. | 428/411.1 |
| 7,513,953 B1 | * | 4/2009 | Felts | 118/719 |
| 7,864,427 B2 | * | 1/2011 | Korenaga et al. | 359/576 |
| 2006/0232735 A1 | * | 10/2006 | Hokazono et al. | 349/122 |
| 2007/0057400 A1 | * | 3/2007 | Kung et al. | 264/141 |
| 2007/0262705 A1 | * | 11/2007 | Fukuda et al. | 313/504 |
| 2007/0281089 A1 | * | 12/2007 | Heller et al. | 427/255.5 |
| 2008/0085418 A1 | * | 4/2008 | Fukuda et al. | 428/447 |
| 2009/0272322 A1 | * | 11/2009 | Fujinami et al. | 118/723 R |

FOREIGN PATENT DOCUMENTS
JP 11-070611 A 3/1999

OTHER PUBLICATIONS

Graff, G.L., et al., "Mechanisms of vapor permeation through multilayer barrier films: Lag time versus equilibrium permeation", Journal of Applied Physics, vol. 96, No. 4, Aug. 15, 2004, pp. 1840-1849.*
Walther, M., et al., "Multilayer barrier coating system produced by plasma-impulse chemical vapor deposition (PICVD)". Surface and Coatings Technology 80 (1996) 200-202.*
Patelli, Alessandro, et al., "SiOx-Based Multilayer Barrier Coatings Produced by a Single PECVD Process". Plasma Process. Polym. 2009, 6, S665-S670.*

* cited by examiner

Primary Examiner — Bret Chen
(74) Attorney, Agent, or Firm — Sughrue Mion, PLLC

(57) ABSTRACT

A method of forming a gas barrier layer comprises: forming a first layer over a substrate by plasma-enhanced CVD at a first pressure, at least a part of a surface of the substrate being made of an organic material; and forming a second layer on the first layer by plasma-enhanced CVD at a second pressure which is lower than the first pressure.

7 Claims, 2 Drawing Sheets

METHOD OF FORMING GAS BARRIER LAYERS INCLUDING A CHANGE IN PRESSURE, A GAS BARRIER LAYER FORMED BY THE METHOD, AND A GAS BARRIER FILM

BACKGROUND OF THE INVENTION

The present invention relates to the technical field of a gas barrier layer to be formed by plasma-enhanced CVD, more particularly to a method by which a gas barrier layer having high gas barrier quality can be formed using a substrate a surface of which is made of organic materials such as high-molecular weight compounds.

A gas barrier film (a water-vapor barrier film) having a gas barrier layer as a component is utilized not only at those sites or parts of optical devices, display apparatuses (e.g. liquid-crystal displays and organic EL displays) as well as various other devices including semiconductor devices and thin-film solar batteries which are required to be moisture-proof, but also in packaging materials used to pack foods, clothing items, electronic components, etc.

The gas barrier layer is a layer that is made of materials such as silicon oxide and silicon nitride that exhibit gas barrier quality and it is formed by a vapor-phase deposition process (vacuum deposition process) such as sputtering or CVD on a surface of the site that is required to be moisture-proof. Also used advantageously is a gas barrier film which is such that the above-mentioned gas barrier layer made of silicon nitride or the like is formed on a surface of films made of high-molecular weight materials (plastic films) or metal films.

An exemplary method of forming a gas barrier layer is plasma-enhanced CVD.

JP 11-70611 A discloses a gas barrier film comprising a substrate that is made of a transparent organic material and which has formed on one or both of its surfaces a gas barrier layer which is a silicon oxide layer having 5-15% carbon, characterized in that the gas barrier layer is formed by plasma-enhanced CVD using an organosilicon compound gas and an oxygen gas as reaction gases.

As mentioned above, the gas barrier layer is a layer that is made of materials such as silicon nitride and silicon oxide that exhibit gas barrier quality and it is formed on a surface of a substrate such as a plastic film by a vapor-phase deposition process such as sputtering or CVD.

Needless to say, the gas barrier layer is formed in a sufficient thickness to meet the gas barrier performance required by a specific use of the final product (gas barrier film).

However, if the idea disclosed in JP 11-70611 A is applied to form a gas barrier layer by plasma-enhanced CVD on a substrate such as a plastic film that has a surface made of an organic material, it often occurs that the gas barrier layer, although it has the intended thickness, fails to have the intended gas barrier performance for its specific thickness.

SUMMARY OF THE INVENTION

An object, therefore, of the present invention is to solve the above-mentioned problem of the prior art by providing a method by which a gas barrier layer that exhibits the intended gas barrier performance for its specific thickness can be formed.

Another object of the present invention is to provide a gas barrier layer formed by the method. Yet another object of the present invention is to provide a gas barrier film having such a gas barrier layer.

A method of forming a gas barrier layer according to the present invention comprising:

forming a first layer over a substrate by plasma-enhanced CVD at a first pressure, at least a part of a surface of the substrate being made of an organic material; and forming a second layer on the first layer by plasma-enhanced CVD at a second pressure which is lower than the first pressure.

A gas barrier layer according to the present invention formed by the method.

DETAILED DESCRIPTION OF THE INVENTION

On the following pages, the method of the present invention for forming gas barrier layers is described in detail, together with the gas barrier layer formed by this method.

Figure 1:
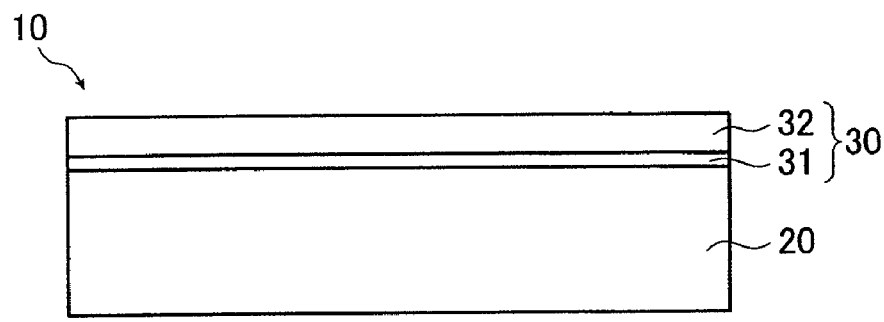
FIG. 1 is a sectional view showing a gas barrier film having a gas barrier layer formed by a forming method according to an embodiment of the present invention.

As shown in FIG. 1, the method of the present invention comprises forming a gas barrier film 10 by overlaying a substrate 20 having a surface made of an organic material with a gas barrier layer 30 through plasma-enhanced CVD, characterized by the pressure (the pressure for film deposition) in a chamber when discharging electricity.

In particular, to form the gas barrier layer 30 on the surface of the substrate 20, a first layer 31 in a specified thickness is formed with electric discharge at a first pressure by plasma-enhanced CVD, and thereafter a second layer 32 is formed with electric discharge at a second pressure, which is lower than the first pressure, by plasma-enhanced CVD, the second layer 32 being formed of the same material as that of the first layer 31.

The substrate 20 may be of various types as long as at least a part of a surface thereof is formed of organic materials such as high-molecular weight materials (polymers) or resin materials and if they permit the formation of the gas barrier layer by plasma-enhanced CVD. Specifically, advantageous examples include substrates made of high-molecular weight materials such as polyethylene terephthalate (PET), polyethylene naphthalate, polyethylene, polypropylene, polystyrene, polyamides, polyvinyl chloride, polycarbonates, polyacrylonitrile, polyimides, polyacrylate, and polymethacrylate.

The substrate 20 is advantageously in film form (sheet form) but this is not the sole case and various kinds of articles (components) whose surface is made of organic materials can also be employed, as exemplified by optical devices such as lenses and optical filters, photoelectric transducers such as organic ELs and solar batteries, and display panels such as liquid-crystal displays and electronic papers.

Further in addition, the substrate 20 may be such that it comprises, as the main body, one of those articles that are made of plastic films or organic materials, metal films or glass sheets, or various metal articles and the like and which has formed on one of its surfaces (the side where the gas barrier layer is to be formed) those layers that are made of organic materials to provide various functions (e.g., a protective layer, an adhesive layer, a light reflecting layer, a light shield layer, a planarizing layer, a buffer layer, and a stress relaxing layer).

The gas barrier layer 30 is formed on that surface of the substrate 20 by plasma-enhanced CVD, and all known types of plasma-enhanced CVD techniques can be employed, as exemplified by CCP (capacitively coupled plasma)-enhanced CVD and ICP (inductively coupled plasma)-enhanced CVD.

When the prior art described above was used to form a gas barrier layer by plasma-enhanced CVD on the substrate such as a plastic film that had a surface made of organic materials, the resulting gas barrier layer had the intended thickness (a sufficient thickness to provide the required gas barrier quality) and yet it did not have the intended gas barrier quality; as a result, it often occurred that the gas barrier film as the final product also failed to have the desired gas barrier quality.

The present inventor made an intensive study with a view to identifying the cause of that phenomenon and found that when a gas barrier layer was formed by plasma-enhanced CVD on the surface made of an organic material, there was formed a layer in which the organic material mixed with the material (component) of the gas barrier layer, which caused the phenomenon at issue.

Suppose a gas barrier layer is being formed on the surface of an organic material by plasma-enhanced CVD; at the time when plasma generation started, components (such as radicals, ions, and electrons) of the plasma incident on the substrate, since it has high enough energy, will get into the bulk of the substrate (organic material) to form a mixed layer in which the organic material intermingles with the material that is to form the gas barrier layer. The amount of the organic material in the mixed layer decreases with the progress of the formation of the gas barrier layer, and a pure gas barrier layer portion with no organic material is eventually formed.

Thus, an attempt to form a gas barrier layer by plasma-enhanced CVD on the surface made of an organic material results in the formation of a mixed layer at the interface between the substrate and the pure gas barrier layer.

It should be noted here that the mixed layer does not have as effective gas barrier quality as the pure gas barrier layer. Hence, if a thick enough mixed layer is formed in such a case that the gas barrier layer is a silicon compound or aluminum compound film that is formed by a vapor-phase deposition process and which requires a certain thickness in order to exhibit gas barrier quality (i.e., a gas barrier layer that depends on its thickness for exhibiting gas barrier quality), the thickness of a substantial gas barrier layer that can be formed is too small to ensure the intended gas barrier quality.

If a sufficiently thick gas barrier layer is formed in order to compensate for the loss in gas barrier quality due to the formation of the mixed layer, it is possible to secure the intended gas barrier quality. However, the gas barrier layer formed by this method is so thick that the production rate of gas barrier films with a coating of the gas barrier layer deteriorates in points of material cost and production time of the gas barrier layer.

The present inventor conducted intensive studies with a view to solving those problems. As a result, the inventor found that the larger the pressure when discharging electricity, i.e., the higher the pressure for film deposition is in plasma-enhanced CVD, the thinner the mixed layer can be made (formation of the mixed layer can be suppressed).

In the meantime, the present inventor also found that the lower pressure when discharging electricity, i.e., the lower pressure or film deposition, is more effective in terms of forming the gas barrier layer which is stable over time and dense to have high gas barrier quality.

The method of the present invention for forming gas barrier layers has been accomplished on the basis of these findings; to form the gas barrier layer 30 through plasma-enhanced CVD on the substrate 20 whose surface is made of an organic material, deposition is initiated at the first pressure to form the first layer 31 in a specified thickness, and then the second layer 32 is formed at the second pressure that is lower than the first pressure.

To be more specific, at the beginning, the first layer 31 is formed on the surface of the substrate 20 at the first pressure which is so high that it is difficult to form the mixed layer, and thereafter the first pressure is changed to the second pressure which is low enough to assure high gas barrier quality in addition to excellent stability over time so that the second layer 32 is formed on the first layer 31; as a result, the generation of the mixed layer is suppressed (the formed mixed layer is thin enough) and, what is more, the gas barrier layer 30 formed is adequately dense.

Thus, according to the present invention, one can form a gas barrier layer most of which is substantially excellent in stability over time and, besides, which is dense to have high gas barrier quality; hence, the gas barrier layer 30 having the intended gas barrier quality can be formed consistently. In addition, the suppression of the mixed layer combines synergistically with the improvement in film density to enable reduction in the thickness of the gas barrier layer 30, thus leading to an improvement in the production rate of gas barrier films due, for example, to reduced the materials cost, better utilization of materials, and shorter production time.

In the present invention, the first pressure is not particularly limited and may be determined as appropriate for such factors as the type (composition) of the gas barrier layer 30 to be formed, the types of reaction gases to be used, the deposition rate, the thickness of the gas barrier layer, and the gas barrier quality required. The first pressure may preferably be 80 to 300 Pa.

By setting the first pressure to between 80 and 300 Pa, favorable results can be obtained, such as: generation of the mixed layer is suppressed more effectively; the thickness of the mixed layer reduced while ensuring that the gas barrier layer formed at the first pressure exhibits comparatively high gas barrier quality; and side reactions (typically, oxidization) during formation of the first layer 31 at the first pressure can be suppressed.

In addition, the first pressure is preferably at least 1.5 times the second pressure and is particularly preferably at least 3 times the second pressure.

By satisfying the relationship between the first pressure and the second pressure described above, favorable effects such as ensuring the better gas barrier quality can be obtained.

In the present invention, electric power (electric power discharged to generate plasma, i.e., plasma excitation power, in plasma-enhanced CVD) applied for forming the first layer 31 at the first pressure is not particularly limited and may be determined as appropriate for such factors as the type (composition) of the gas barrier layer 30 to be formed, the types of reaction gases to be used, the deposition rate, the thickness of the gas barrier layer, and the gas barrier quality required.

The lower limit of the thickness of the first layer 31 (a mixed layer/gas barrier layer) to be formed at the first pressure is not particularly limited but is preferably set as appropriate for such factors as the thickness of the desired gas barrier layer 30.

It should be noted here that according to the study of the present inventor, formation of the first layer 31 at the first pressure preferably continues until its thickness reaches at least 3 nm. In particular, it is more preferred to continue the formation of the first layer 31 until its thickness reaches at least 5 nm.

By forming the layer at the first pressure until its thickness reaches at least 3 nm, in particular, at least 5 nm, the formation of the mixed layer can be brought to an end more positively so that the generation of the mixed layer during film formation at the second pressure, which is a favorable condition for the formation of the mixed layer at a low enough pressure, can be prevented more positively.

Note that the thickness of the first layer 31 can be controlled by every known method of thickness control that is employed in vapor-phase deposition processes, including use of the deposition rate as determined preliminarily by experimentation or simulation and measurement of the actually formed layer with a laser displacement sensor or the like.

Similarly, the upper limit of the thickness of the gas barrier layer 31 is not particularly limited, either.

However, as already noted earlier, the second layer 32 which is formed at the second pressure is denser and, hence, features better gas barrier quality than the first layer 31 formed at the first pressure. Thus, in the present invention, the thicker the second layer 32 formed at the second pressure is, the more advantageous the gas barrier layer 30 of the desired thickness is in terms of gas barrier quality.

Considering all these points together, the thickness of the first layer 31 formed at the first pressure is preferably adjusted to 30 nm or less, in particular, 15 nm or less.

In the present invention, the second pressure is not particularly limited, either, as long as it is lower than the first pressure, and may be determined as appropriate for such factors as the type of the second layer 32 to be formed, the types of reaction gases to be used, the deposition rate, the thickness of the gas barrier layer 30, and the gas barrier quality required.

The second pressure is preferably in the range of 10 to 60 Pa. By adjusting the second pressuring in the range of 10 to 60 Pa, favorable results can be obtained, such as: the gas barrier layer that is dense to have high gas barrier quality can be formed; a cost for the production apparatus can be lowered; and excessive temperature elevation to damage the structure of the substrate can be prevented.

Here, the second pressure is preferably $1/1.5$ or smaller, in particularly, $1/3$ or smaller of the first pressure.

In addition, electric power (electric power discharged to generate plasma, i.e., plasma excitation power, in plasma-enhanced CVD) applied for forming the second layer 32 at the second pressure is not particularly limited and may be determined as appropriate for such factors as the type of the gas barrier layer to be formed, the types of reaction gases to be used, the deposition rate, the thickness of the gas barrier layer, and the gas barrier quality required.

The electric power (W) during formation of the second layer 32 at the second pressure is preferably 0.8 W/cm$^2$ or higher, particularly 2 W/cm$^2$ or higher with respect to the area (cm$^2$) of the substrate (surface area on which the gas barrier layer is formed).

According to the study by the present inventor, the higher the electric power applied during formation of the gas barrier layer 30 in plasma-enhanced CVD is, the denser and the better gas barrier quality the gas barrier layer 30 thus formed obtains. Particularly, by adjusting the electric power with respect to the substrate surface area to 0.8 W/cm$^2$ or higher, the gas barrier layer 30 with excellent gas barrier quality can be formed.

At the same time, however, with the higher electric power, the already-described mixed layer is more easily formed; in particular, applying electric power of as high as 0.8 W/cm$^2$ or higher to the surface of the substrate 20 such as a plastic film, the surface being made of an organic material, to form the gas barrier layer 30 thereon would result in formation of the mixed layer in a significant thickness. And, if the thick mixed layer were formed, the thickness of gas barrier layer 30 would also have to be thick in order to have the desired gas barrier quality, as described earlier.

In the present invention, however, as already described, the first layer 31 has been formed at the first pressure prior to formation of the second layer 32 at the second pressure, and formation of the mixed layer has been (mostly) completed during the formation of the first layer 31. Hence, even if the second layer 32 is formed at the second pressure with the higher electric power which is more likely to form the mixed layer, no (or very little) mixed layer would be formed. In addition, the gas barrier layer having a small mixed layer can exhibit the intended gas barrier quality for its thickness, and the gas barrier layer can be thin while obtaining good gas barrier quality.

More specifically, by adjusting the electric power applied during forming the second layer 32 at the second pressure to at least 0.8 W/cm$^2$, in particular, at least 2 W/cm$^2$, with respect to the surface of the substrate 20, the effects and features of the present invention can be preferably realized, forming the gas barrier layer having the better gas barrier quality with the lower material cost.

The thickness of the second layer 32 formed at the second pressure can be set as appropriate for such factors as the thickness of the first layer formed at the first pressure, the intended thickness of the gas barrier layer 30 (thickness of the final gas barrier layer), required gas barrier quality, and the specific use of the gas barrier layer (the use of the substrate on which the layer is formed).

Take, for example, the case of forming a silicon nitride film or a silicon oxide film as the gas barrier layer 30, the preferred thickness of the gas barrier layer 30 is about 20 to 1000 nm.

Note that the gas barrier layer 30 in the intended thickness can be formed of the first layer 31 formed at the first pressure and the second layer 32 formed at the second pressure.

For instance, in the case of the silicon nitride film, the gas barrier layer 30 can consist of the first layer 31 and the second layer 32, the total thickness of the two layers falling in the range of between 20 and 1000 nm.

Alternatively, in addition to the first layer 31 formed at the first pressure and the second layer 32 formed at the second pressure, an additional gas barrier layer may be formed under a different, arbitrary deposition condition to form the gas barrier layer 30 in the intended thickness in total. In the case of the silicon nitride film, for example, the first layer 31 formed at the first pressure 1, the second layer 32 formed at the second pressure, and an additional gas barrier layer formed under a different condition altogether can form the gas barrier layer 30 having the total thickness of 20 to 1000 nm.

In other words, on the surface of the substrate 20 that is made of an organic material, as long as the first layer 31 is first formed at the first pressure and the second layer 32 is then formed at the second pressure over the first layer 31, thereafter, an additional layer may be formed under any arbitrary deposition condition to complete the gas barrier layer 30.

Here, the deposition rate (film forming rate) to form the second layer 32 at the second pressure is preferably 100 nm/min. or higher, in particular, 300 nm/min. or higher.

Taking into consideration productivity, production efficiency and the like, the higher deposition rate of the gas barrier layer 30 is also preferable.

In this regard, in the case of forming the gas barrier layer 30 by plasma-enhanced CVD at a deposition rate as high as 100 nm/min. or higher, electric discharge needs to take place at a low pressure in order to obtain good gas barrier quality. However, the lower the pressure for film deposition is, the easier the formation of the above-described mixed layer is. In particular, a considerably thick mixed layer is formed if the gas barrier layer 30 is formed on the surface of a plastic film or the like, which is made of an organic material, at a low enough pressure to obtain good barrier quality at the deposition rate as high as at least 100 nm/min. In addition, in the case a very thick mixed layer is formed, the intended gas barrier quality cannot be obtained unless the gas barrier layer 30 is formed to be very thick.

In the present invention, however, formation of the first layer 31 at the first pressure is completed, and thus, formation of the mixed layer has been (mostly) completed, prior to formation of the second layer 32 at the second pressure, as described above. Thus, even if the second layer 32 is formed at the second pressure which is low enough to obtain good gas barrier quality at the above-described deposition rate, no (or very little) mixed layer would be formed. Moreover, due to the very little mixed layer, the intended gas barrier quality for its thickness can be realized, and the gas barrier layer can be thin while obtaining good gas barrier quality.

More particularly, the effects and features of the present invention can be preferably realized by adjusting the deposition rate to form the second layer 32 at the second pressure to at least 100 nm/min., in particular, at least 300 nm/min.; the gas barrier layer 30 having good gas barrier quality can be formed at a low cost with high production efficiency.

In the present invention, the material of the gas barrier layer 30 to be formed is not particularly limited and all known types of gas barrier layer can be employed as long as they can be formed by plasma-enhanced CVD on the surface made of an organic material.

For especial reasons such as the ability by which the effect of the present invention can be exhibited advantageously, particularly preferred gas barrier layers are those which are made of silicon compounds such as silicon oxide, silicon nitride, silicon oxynitride and silicon oxynitrocarbide. Among these silicon compounds, silicon nitride is an advantageous example.

During plasma-enhanced CVD of the gas barrier layer 30, particularly one that is made of a silicon compound, film quality such as gas barrier quality may deteriorate due, for example, to side reactions (mainly oxidation) that occur during the process of film formation.

Such side reactions are more likely to occur at the higher pressure when discharging electricity. In addition, nitrides are most adversely affected by the side reactions which are mainly oxidation.

In the present invention, as described earlier, the first layer 31 is first formed at the first pressure and thereafter the second layer 32 is formed at the second pressure which is lower that the first pressure. Hence, according to the present invention, the side reactions can be suppressed more easily during formation of the second layer 32. In addition, the film formed at the second pressure is usually thicker than what is formed at the first pressure.

Hence, by utilizing the present invention to form the gas barrier layer 30 made of silicon nitride, not only the aforementioned features of the present invention can be obtained but, at the same time, the possible deterioration in film quality due to the side reactions can also be suppressed considerably. As a result, using a silicon nitride film, the gas barrier layer 30 having the intended gas barrier quality can be formed consistently. This is a preferred embodiment since by utilizing the present invention to form a silicon nitride film as the gas barrier layer 30, the effect of the present invention can be exhibited in a more pronounced way.

The reaction gases used to form the gas barrier layer 30 are not particularly limited, either, and all known reaction gases may be used, depending upon the gas barrier layer 30 to be formed.

If a silicon nitride film is to be formed as the gas barrier layer 30, silane gas and ammonia gas and/or nitrogen gas may be used as reaction gases; if a silicon oxide film is to be formed, both silane gas and oxygen gas may be used as reaction gases.

Note that the reaction gases may, if necessary, be used in combination with various other gases such as inert gases including helium gas, neon gas, argon gas, krypton gas, xenon gas and radon gas.

According to the present invention, gas barrier layers are formed of the same materials at both the first pressure and the second pressure by plasma-enhanced CVD.

In the case of forming a silicon nitride film as the gas barrier layer 30, silicon nitride films are formed both in formation of the first layer 31 at the first pressure and formation of the second layer 32 at the second pressure. In the case of forming a silicon oxide film as the gas barrier layer 30, silicon oxide films are formed both in formation of the first layer 31 at the first pressure and formation of the second layer 32 at the second pressure.

As long as the pressures when discharging electricity (the pressures for film deposition) are kept in such a manner that the second pressure to form the second layer 32 is lower than the first pressure to form the first layer 31, other conditions to form the gas barrier layer such as electric current to apply to reaction gasses, flow rate ratio of the reaction gases, electric power discharged to generate plasma, frequency of electricity discharged to generate plasma, deposition temperature (substrate temperature), and deposition rate may be same as those adopted to form the gas barrier layer in the ordinary plasma-enhanced CVD.

Thus, the conditions for forming the gas barrier layer may be set as appropriate for the types of the gas barrier layer 30 to be formed and the reaction gases to be used, the required deposition rate, the desired thickness of gas barrier layer, and the indented gas barrier quality.

Note that between formation of the first layer 31 at the first pressure and formation of the second layer 32 at the second pressure, as long as the pressures when discharging electricity are kept in such a manner that the second pressure is lower than the first pressure, other conditions may be same or different.

In the present invention, a so-called "batch-type" apparatus which forms the gas barrier layer 30 on a single substrate (possibly two or more substrates) 20 may be utilized, or alternatively, a so-called "roll-to-roll type" apparatus can also be used.

In a "roll-to-roll" type apparatus, an elongated substrate 20 which is wound in a roll is transported into a deposition chamber as being unwound, a film is deposited onto the substrate while the substrate is transported in its longitudinal direction in the chamber, and the substrate 20 on which a film has been deposited and which has been evacuated from the chamber is again wound up to be into a roll shape.

In an exemplary embodiment where the present invention is utilized in the batch-type apparatus, once the first layer 31 is formed to be a specified thickness at the first pressure, the pressure when discharging electricity may be switched (changed) from the first pressure to the second pressure to form the second layer 32 in a single plasma-enhanced CVD apparatus (chamber), or in another embodiment, once the first layer 31 is formed to be a specified thickness at the first pressure, the substrate may be taken out of the plasma-enhanced CVD apparatus and brought into another plasma-enhanced CVD apparatus in which the second layer 32 is formed at the second pressure.

And, in an exemplary embodiment where the present invention is utilized in a roll-to-roll apparatus, within a single deposition chamber, multiple deposition spaces for depositing a film through plasma-enhanced CVD, in each of which the pressure can be independently adjusted, are created in the direction the substrate 20 is transported, the first layer 31 may be formed at the first pressure in the deposition space located most upstream in the direction of transporting the substrate, and the second layer 32 may be formed at the second pressure in the next deposition space down in the transporting direction.

Alternatively, multiple plasma-enhanced CVD chambers may be provide in the direction of transporting the substrate, the first layer 31 may be formed at the first pressure in the chamber located most upstream, and the second layer 32 may be formed at the second pressure in the next chamber down in the transporting direction.

While the method of the present invention for forming the gas barrier layer 30 and the gas barrier layer 30 that is formed by the method have been described above in detail, the present invention is by no means limited to the foregoing embodiments and it should be understood that various improvements and modifications can of course be made without departing from the gist of the present invention.

The present invention is described below in further detail with reference to specific examples of the invention.

Example 1

Using a common CVD apparatus of a type that would perform film deposition by the CCP-CVD process, a gas barrier film 10 comprising a substrate 20 with a silicon nitride layer deposited thereon as a gas barrier layer 30 was formed, as shown in FIG. 1.

As the substrate 20, a polyester film with a thickness of 188 μm (LUMINICE, a polyethylene terephthalate film manufactured by TORAY ADVANCED FILM CO., LTD.) was used. The substrate 20 had a surface area of 300 cm$^2$.

The substrate 20 was set up in a predetermined position within a vacuum chamber (process chamber) provided in the CVD apparatus, and the vacuum chamber was then closed.

Subsequently, the interior of the vacuum chamber was evacuated and at the point in time when the internal pressure reached 0.01 Pa, silane gas, ammonia gas and nitrogen gas were introduced into the vacuum chamber as reaction gases. The silane gas was flowed at a rate of 50 sccm, the ammonia gas at 100 sccm, and the nitrogen gas at 500 sccm.

Evacuation of the interior of the vacuum chamber was adjusted such that its internal pressure becomes the first pressure that is described later.

Subsequently, RF power of 600 W having a frequency of 13.56 MHz was applied to electrodes provided in the CVD apparatus as plasma excitation power to start the formation of a silicon nitride film (a gas barrier layer) 30 on a surface of the substrate 20.

Following the formation of a silicon nitride film (the first layer 31) in a thickness of 5 nm, application of the RF power was halted temporarily, and the internal pressure of the vacuum chamber was switched from the first pressure to 50 Pa (the second pressure). Once the internal pressure in the chamber was stabilized at 50 Pa, RF power application was restarted to form another silicon nitride film (the second layer 32) in a thickness of 45 nm, resulting in a silicon nitride film with a thickness of total 50 nm. Since the substrate 20 had a surface area of 300 cm$^2$, electric power discharged to generate plasma during film deposition at the second pressure was 2 W/cm$^2$ with respect to the substrate surface area.

Note that the thickness of the first layer 31 formed at the first pressure (i.e., the timing for the switch from the first pressure to the second pressure) and the thickness of the gas barrier layer 30 (=50 nm) were controlled by deposition rates that were preliminarily determined through experimentation.

In these formations of a silicon nitride film in a thickness of 5 nm (the first layer 31) at the first pressure and of another silicon nitride film in a thickness of 45 nm (the second layer 32) at the second pressure, i.e., 50 Pa, to form the overall silicon nitride film (the gas barrier layer 30) in a total thickness of 50 nm, the first pressure was varied to be 50 Pa (i.e., no change between first and second pressures), 70 Pa, 100 Pa, 150 Pa and 200 Pa to form five samples of gas barrier layer 30 (i.e., five samples of gas barrier film 10 comprising the substrate 20 made of PET and a silicon nitride film formed thereon as the gas barrier layer 30 were prepared.).

The thus prepared five samples of gas barrier layer 30 were measured for water-vapor transmission rate (WVTR g/(m$^2$·day)) by the MOCON method. Note that those samples which exceeded the limit for measurement of WVTR by the MOCON method were measured for WVTR (immediately after preparation of the samples) by the calcium corrosion method (see JP 2005-283561 A).

The results are shown in Table 1 below. And, the relationship between the first pressure and WVTR is shown in FIG. 2.

TABLE 1

| First Pressure (Pa) | WVTR (g/m$^2$ · day) |
|---|---|
| 50 | 0.011 |
| 70 | 0.0079 |
| 100 | 0.0029 |
| 150 | 0.0018 |
| 200 | 0.0019 |

Figure 2:
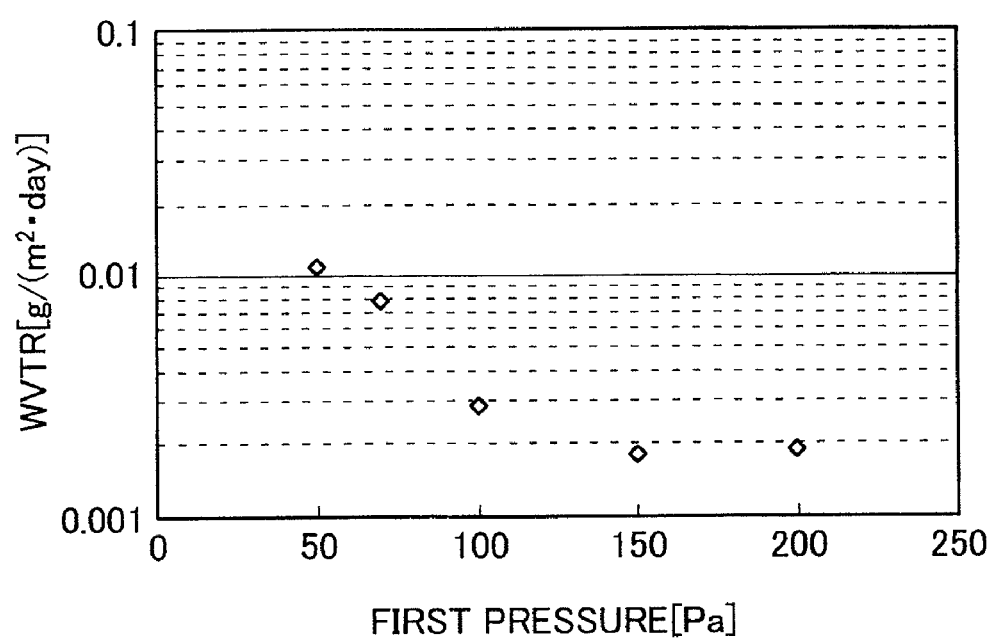
FIG. 2 is a graph showing the result of Example 1.

As shown in Table 1 and FIG. 2, the gas barrier film having the gas barrier layer 30 that was formed by the method of the present invention characterized by forming a silicon nitride film (the first layer 31) on the surface of the substrate 20 at the first pressure and thereafter forming another silicon nitride film (the second layer 32) at the second pressure (50 Pa in this example) which is lower than the first pressure had outstandingly superior gas barrier quality compared to silicon nitride films (gas barrier layers 30) which were formed at a constant pressure.

In particular, by adjusting the first pressure to be at least 1.5 times the second pressure and having the first pressure in the range of 80 to 300 Pa, significantly excellent gas barrier quality can be achieved.

Example 2

Additional five samples of the gas barrier layer in a thickness of 50 nm were prepared (i.e., five samples of gas barrier film 10 comprising the substrate 20 made of PET and a silicon nitride film formed thereon as the gas barrier layer 30 were prepared) as in Example 1, except that the first pressure was fixed to 150 Pa; the second pressure was fixed to 50 Pa, and the timing to switch the pressure from the first pressure to the second pressure was varied such that the thicknesses of a silicon nitride film formed at the first pressure, i.e., the first layer 31, of the resulting samples respectively become 0 nm (i.e., the gas barrier layer 30 was formed at only the second pressure), 3 nm, 5 nm, 10 nm, and 50 nm (i.e., the gas barrier layer 30 was formed at only the first pressure).

The thus prepared samples of gas barrier layer 30 were measured for water-vapor transmission rate, as exactly in the Example 1, immediately after preparation thereof and after a lapse of 1000 hours.

The results are shown in Table 2 below. And, the relationship between the thickness of the silicon nitride film formed at the first pressure (the first layer 31) and WVTR is shown in FIG. 3.

TABLE 2

| Thickness of 1st layer (nm) | Thickness of 2nd layer (nm) | WVTR immediately after preparation (g/m$^2$ · day) | WVTR after 1000 hours (g/m$^2$ · day) |
| --- | --- | --- | --- |
| 0 | 50 | 0.011 | 0.01 |
| 3 | 47 | 0.0044 | 0.0058 |
| 5 | 45 | 0.0018 | 0.0023 |
| 10 | 40 | 0.002 | 0.0041 |
| 50 | 0 | 0.0051 | 0.016 |

Figure 3:
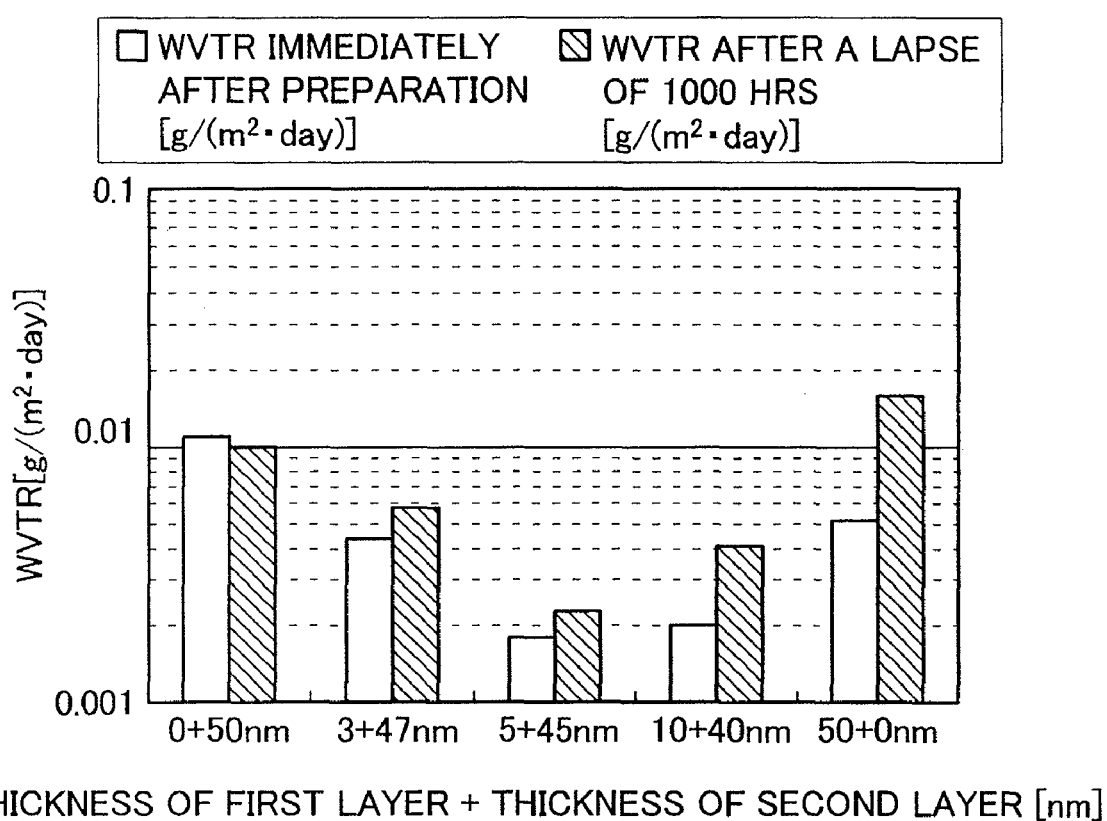
FIG. 3 is a graph showing the result of Example 2.

As shown in Table 2 and FIG. 3, according to the present invention in which the first layer 31 is first formed at the first pressure, and then the second layer 32 is formed at the second pressure that is lower than the first pressure, the resulting gas barrier layer 30 had outstandingly superior gas barrier quality compared to the conventional gas barrier layer 30 all formed constantly at either the first pressure or the second pressure.

In addition, the gas barrier layer 30 formed in accordance with the present invention kept excellent gas barrier quality even after a lapse of 1000 hours, indicating good stability over time.

What is claimed is:

1. A method of forming a gas barrier layer comprising:
    forming a first layer over a substrate by plasma-enhanced CVD at a first pressure, at least a part of a surface of the substrate being made of an organic material; and
    forming a second layer on the first layer by plasma-enhanced CVD at a second pressure which is lower than the first pressure.

2. The method according to claim 1, wherein the first pressure is at least 1.5 times the second pressure.

3. The method according to claim 1, wherein the first layer is formed at the first pressure until its thickness is 3 nm or more.

4. The method according to claim 1, wherein the first pressure is 80 to 300 Pa.

5. The method according to claim 1, wherein a plasma excitation power for film deposition at the second pressure is 0.8 W or more per square centimeter of the surface of the substrate.

6. The method according to claim 1, wherein a deposition rate to form the second layer at the second pressure is 100 nm/minute or higher.

7. The method according to claim 1, wherein the gas barrier layer comprises a film mainly made of a silicon oxide, silicon nitride, silicon oxynitride, or silicon oxynitride carbide.

* * * * *